(12) United States Patent
McGinty et al.

(10) Patent No.: US 10,900,993 B2
(45) Date of Patent: Jan. 26, 2021

(54) SINGLE AXIS ACCELEROMETER WITH INERTIAL THRESHOLD

(71) Applicant: MechOptix, Inc., Huntsville, AL (US)

(72) Inventors: Joseph McGinty, Madison, AL (US); Jeffery B Hammock, Madison, AL (US)

(73) Assignee: MECHOPTIX, INC., Huntsville, AL (US)

( * ) Notice: Subject to any disclaimer, the term of this patent is extended or adjusted under 35 U.S.C. 154(b) by 181 days.

(21) Appl. No.: 16/258,357

(22) Filed: Jan. 25, 2019

(65) Prior Publication Data

US 2020/0241034 A1 Jul. 30, 2020

(51) Int. Cl.
| | | |
|---|---|---|
| *G01P 1/02* | (2006.01) | |
| *G01P 15/10* | (2006.01) | |
| *G01P 15/04* | (2006.01) | |
| *G01P 15/105* | (2006.01) | |
| *H01L 43/04* | (2006.01) | |
| *H01L 43/10* | (2006.01) | |
| *G01P 15/08* | (2006.01) | |

(52) U.S. Cl.
CPC ............ *G01P 15/105* (2013.01); *G01P 1/023* (2013.01); *G01P 15/04* (2013.01); *H01L 43/04* (2013.01); *H01L 43/10* (2013.01); *G01P 2015/0834* (2013.01); *G01P 2015/0837* (2013.01)

(58) Field of Classification Search
CPC ............ G01P 15/10; G01P 1/02; G01P 15/04
See application file for complete search history.

(56) References Cited

U.S. PATENT DOCUMENTS

| | | |
|---|---|---|
| 2,108,695 A | 2/1937 | Tapley |
| 3,835,273 A | 9/1974 | Stolarik |
| 4,151,751 A | 5/1979 | McCaslin |
| 4,496,808 A | 1/1985 | Alexander |
| 4,533,801 A | 8/1985 | Jackman |
| 4,856,333 A | 8/1989 | Ito |
| 5,222,387 A | 6/1993 | Hamaue |
| 5,241,862 A | 9/1993 | Abbink |
| 5,450,049 A | 9/1995 | Bachmann |
| 5,495,762 A | 3/1996 | Tamura |
| 2010/0024590 A1* | 2/2010 | O'Neill .................. G01L 5/225 74/594.1 |
| 2011/0066397 A1* | 3/2011 | Kranz .................... G01C 22/02 702/141 |
| 2014/0123756 A1* | 5/2014 | Consoli ............... G01P 15/0802 73/514.36 |

* cited by examiner

*Primary Examiner* — Jewel V Dowtin
(74) *Attorney, Agent, or Firm* — Patent Grove, LLC; Tomas Friend

(57) ABSTRACT

A single axis accelerometer comprising a swing arm pivotally attached to a frame is held in apposition to a stop by a threshold force until an experienced acceleration force greater than the threshold force causes a distal segment of the swing arm to release from the stop and move toward a sensor that is activated by a sensor trigger on the distal segment of the swing arm.

14 Claims, 5 Drawing Sheets

SINGLE AXIS ACCELEROMETER WITH INERTIAL THRESHOLD

BACKGROUND OF THE INVENTION

Field of the Invention

The present invention relates generally to providing a single axis accelerometer for accurate acceleration/deceleration measurement with minimal influence from all other axes. More specifically, the invention relates to a single axis accelerometer having a threshold inertia that is optionally adjustable.

Discussion of Related Art

Automatic deceleration indication in automotive applications can be achieved by using a 3-axis accelerometer to measure the force of the deceleration and illuminating a brake light if the measured force of deceleration exceeds a pre-determined threshold. Examples of inventions providing such indication are disclosed in U.S. Pat. No. 9,327,642 and US 2018/0009372. Vehicle motion due to rough road surfaces, inadequate or sport-tuned suspension, incline/decline angle, and lateral forces when turning can contribute forces to the measured deceleration force that must be filtered out in order to achieve proper automatic brake light illumination without a significant number of false illuminations. The 3-axis accelerometer plus filtering algorithm approach is sufficient for most passenger vehicles on typical roadways. However, attempts to port this technology to all vehicle platforms have been difficult. No adequate solution exists for recreational and fishing boats, personal watercraft, snowmobiles, or bicycles, for example, in part because these vehicles exhibit motion dynamics and g-forces more intense than passenger vehicles on roadways. The current state of the art uses 3-axis Micro Electromechanical Systems (MEMS) accelerometers that have very low mass and are subsequently susceptible to false deceleration g-force measurements in certain types of high vibration environments.

The use of a pendulum to measure acceleration predates the use of MEMS accelerometers and methods based on this approach have been proposed as ways of measuring deceleration, or negative acceleration, of motor vehicles. For example, U.S. Pat. No. 3,835,273 describes a multi-directional crash sensor for a vehicle, in which a pendulum with an electrical contact is pivoted within a housing for motion in any direction in response to acceleration. U.S. Pat. No. 4,151,571 describes an accelerometer for attachment to the dashboard of a vehicle, including a pendulum in a housing mounted on a pendulum arm and is attached perpendicularly to an indicating needle that sweeps across a calibrated meter face to indicate the acceleration of the vehicle. U.S. Pat. No. 4,496,808 describes an electrical switch that is actuated when a pendulum swings a predetermined distance to close an electrical contact.

A servo type accelerometer uses photoelectric elements to detect a rotational displacement of a pendulum proportional to an acceleration force and a current corresponding to the detected displacement is applied to a coil, which exerts a force on the pendulum to drive it toward its original position before an applied force of acceleration. The current applied to the coil is proportional to the acceleration force so the acceleration can be measured. An example of this type of accelerometer is described in U.S. Pat. No. 4,856,333.

U.S. Pat. No. 4,533,801 describes an inertia switch that can be used in an electrical circuit to release electrically operated vehicle door locks or to turn of a vehicle's fuel pump in the event of an accident. U.S. Pat. No. 5,222,387 describes a swinging pendulum acceleration sensor with a mechanism that tilts a frame of the sensor to change the position of the pendulum along a path of swinging motion and change the sensitivity of the accelerometer. Tilting the sensor changes the distance that the pendulum swings before contacting a microswitch.

U.S. Pat. No. 5,241,862 describes a hinged, pendulous mass type accelerometer with a planar support base having an internal aperture and a pendulous mass that includes a pair of arms. A pair of spaced flexible hinges pivotally supports the pendulous mass within the aperture. A shadow paddle between a LED and a photodetector interrupts light transmission when the pendulous mass is unstressed in the absence any external acceleration force. An acceleration force on the plane of the base causes a displacement of the shadow paddle so that light, proportional in amount to the physical degree of displacement of the shadow paddle, is detected at the photodetector to generate a detection signal.

While the aforementioned accelerometers provide useful acceleration detection for a wide variety of applications, none of these accelerometers are suitable for the detection of threshold acceleration or deceleration (negative acceleration) forces in vehicles experiencing motion dynamics and g-forces more intense than those typically experienced by trucks and passenger vehicles on roadways for the purpose of usefully indicating deceleration. A number of the accelerometers are too large or too heavy for use with bicycles or require constant power at levels that prevent battery powered use. Some of the accelerometers are designed primarily for a single detection event such as a car crash and/or must be reset after each reported acceleration event. Accordingly, there is a need for methods and devices for reliably measuring and/or detecting acceleration/deceleration exceeding a threshold value in vehicles such as recreational and fishing boats, personal watercraft, snowmobiles, and bicycles.

BRIEF SUMMARY OF THE INVENTION

The present invention solves the problem of detecting a threshold deceleration, or negative acceleration, even in high vibration environments, so that a threshold deceleration can be reliably detected, indicated, and/or acted upon. Technically, the solution involves a single axis accelerometer with an inertial threshold comprising a swing arm that is constrained to swing in around a single axis. The swing arm is permanently prevented from moving in response to an acceleration force in a first direction and prevented from moving in response to acceleration in a second, opposite direction having less than a threshold force. Upon experiencing an acceleration force in the second direction that is greater than the threshold force, the swing arm moves to a position that activates a sensor configured to indicate that an acceleration force in excess of the threshold force has been experienced. Detection may be limited to accelerations sustained for a preset minimum duration to prevent indication of and/or response to fleeting accelerations even above the threshold value to prevent detection of fleeting accelerations associated with travel over rough surfaces.

The single axis accelerometer can be used in a method for detecting acceleration/deceleration by all sorts of vehicles, including those that experience much vibration and/or move at relatively low speed such as recreational boats, fishing boats, personal watercraft, snowmobiles, and bicycles. False indications of deceleration caused, for example, by sharp turns or traversing uneven or inclined or declined surfaces are prevented by the device and method of the invention. Movement of the pendulum is limited so that acceleration is detected in only one direction along one axis and only when the force of acceleration in that direction exceeds a threshold value. The accelerometer may be constructed so that the threshold value of acceleration is easily adjustable. A single axis accelerometer according to the invention may be constructed to have a small size, low weight, and low power consumption when compared to many existing pendulum type accelerometers. As an alternative to a swinging pendulum, a spheroidal mass contained within a guide may be used for certain applications.

The invention has broad utility for detecting acceleration in many environments, including recreational and fishing boats, snowmobiles, personal watercraft, bicycles, and vehicles that employ electromagnetic forces to decelerate without applying brakes, for example using an electromagnetic retarder. Detected acceleration events may be used to generate acceleration visible and/or audible acceleration signals, generate and store acceleration event data, and/or control operations that influence or are influenced by acceleration.

BRIEF DESCRIPTION OF THE DRAWINGS

A more complete understanding of the present invention is derived by referring to the detailed description and claims when considered in connection with the figures, wherein like reference numbers refer to similar items throughout the figures and in which:

DETAILED DESCRIPTION OF THE INVENTION

All art specific terms used herein are intended to have their art-accepted meanings in the context of the description unless otherwise indicated. All non art specific terms are intended to have their plain language meaning in the context of the description unless otherwise indicated.

As used herein, for a sensor to be engaged by a sensor trigger means that the trigger is in apposition to the sensor in a position to activate the sensor.

Embodiments of an accelerometer and methods of operation are shown in FIGS. 1-5 and used to explain technical features of the invention and their technical effects. The invention may be embodied as any number of variations of the embodiment shown in the figures and described herein.

Figure 1:
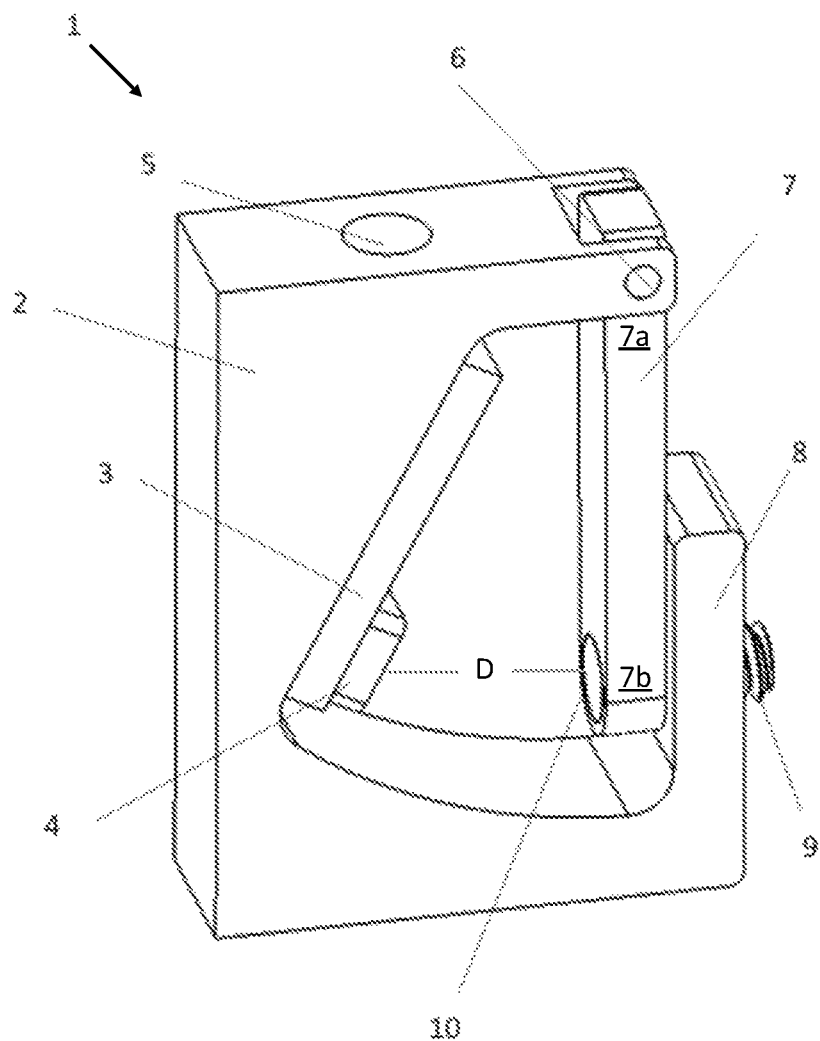
FIG. 1 is a side, upper front perspective view of one embodiment of a sensor assembly.
Figure 2:
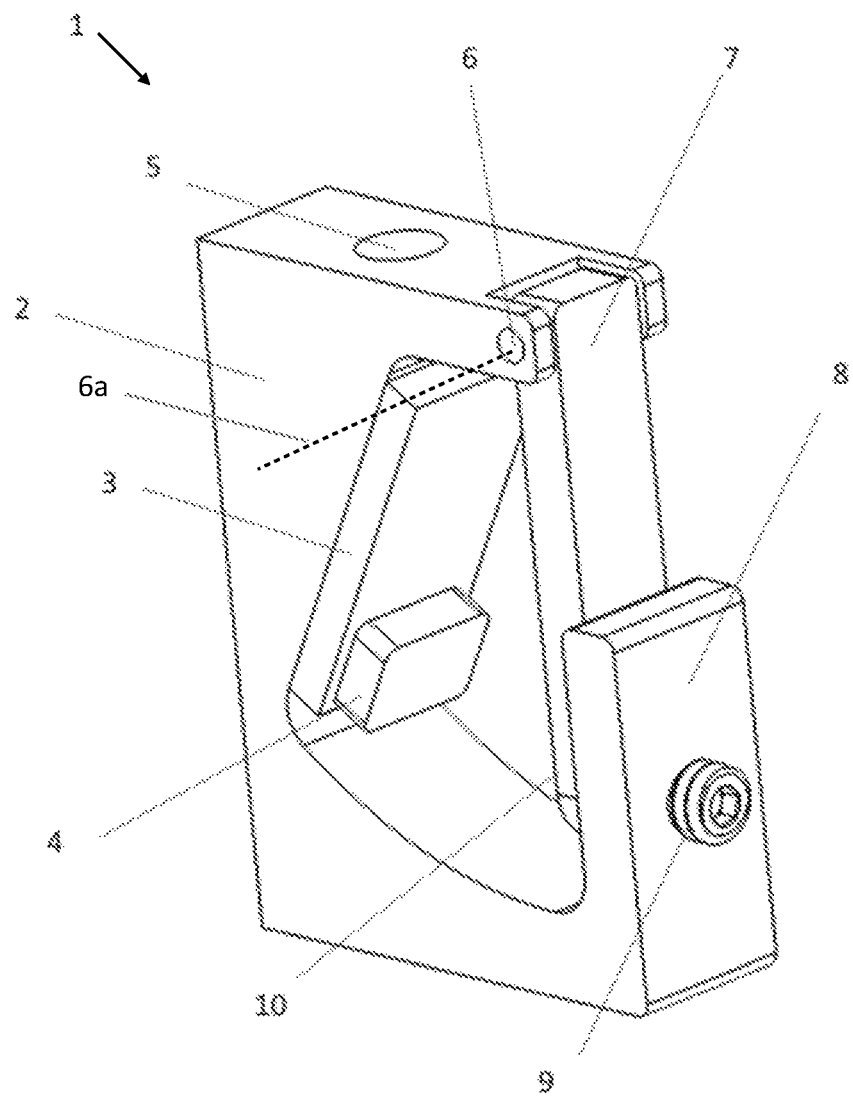
FIG. 2 is a side, upper back perspective view of one embodiment of a sensor assembly.

FIGS. 1 and 2 show an exemplary embodiment of an accelerometer assembly (1) comprising a frame (2), a swing arm (7), a sensor (4), a printed circuit board (PCB) (3), a stop (8), and a threshold setting device (9). The frame (2) in this example is embodied as a unitary structure comprising the stop (8) and housing the sensor (4), the PCB (3), and the threshold setting device (9). Other embodiments of the accelerometer (1) may comprise a frame (2) comprising separate stop (8), sensor (4), PCB (3), and threshold setting device (9) components that are reversibly or irreversibly attached the the frame (2). The stop (8) and/or the threshold setting device (9) may either be integral to the frame or attached to the frame. Reversible attachment to the frame (2) may be by one or more of screws, clamps, clasps, snap fits, interference fits, and tape, for example. Examples of irreversible attachment may include rivets, welds, and adhesives such as glues and epoxy resins. A unitary structure may be made by injection molding, three dimensional printing, or other suitable methods. The size of the frame may vary depending on the types of sensor (4), threshold force, and application. The maximum dimension of the frame (2) may be, for example, between about 2 cm and about 8 cm but may be larger or smaller. The frame (2) may be made from any suitable material such as a commonly used hard plastic.

The swing arm (7) is connected to the frame (2) via a connection that allows it to swing around a pivot axis (6a). The swing arm comprises a proximal segment (7a) that is connected to the frame (2) through a pivoting connection (6) such as a pivot pin or hinge and a distal segment (7b) comprising a sensor trigger (10, 10a) and a threshold engagement element (10, 10b). For the embodiments shown in the figures, the swing arm (7) swings through approximately the same arc but the range of swing may be larger or smaller in other embodiments. It is preferred that the swing has a maximum arc of less than 50 degrees and at least 15 degrees. The sensor trigger and threshold engagement element may be embodied as a single, same sensor trigger and threshold engagement element (10) as indicated, for example, in FIG. 1, or as separate sensor trigger (10a) and threshold engagement element (10b) as indicated, for example, in FIG. 3.

The purpose of the sensor trigger is to interact with the sensor (4) to trigger a sensor signal indicative of a force applied to the accelerometer and swing arm (7) in a direction toward the sensor (4) that is in excess of a threshold force. The purpose of the threshold engagement element (10,10b) is to interact with the threshold setting device (9) to prevent the movement of the distal segment (7b) of the swing arm (7) toward the sensor (4) unless a threshold force is exceeded. The threshold engagement element (10, 10b) and threshold setting device (9) may interact through a magnetic force or a negative pressure such as a vacuum, for example to generate an attracting force that must be overcome before the swing arm (7) can move.

In the case of a magnetic force, the threshold engagement element (10, 10b) and threshold setting device (9) may comprise magnets, a magnet and a ferromagnetic material, or a ferromagnetic material and a magnet, respectively. The magnets may be permanent magnets, correlated magnet arrays, or electromagnets. In a preferred embodiment, the threshold engagement element (10, 10b) is a permanent magnet and the threshold setting device (9) comprises a ferromagnetic material that is attracted to the permanent magnet with a force that is equal to the threshold force. In a most preferred embodiment, the threshold engagement element (10, 10b) is a rare earth magnet and the threshold setting device (9) is embodied as a screw threaded into the block (9) of the frame (2) such that turning the screw moves the ferromagnetic material closer to or further away from the threshold engagement element when it rests against the stop (9), thereby making it possible to increase or decrease the threshold force by turning the threshold setting device (9). A manually controlled or processor controlled actuator (16, FIG. 3) may be attached to the threshold setting device (9) to control movement thereof to provide more precise and/or automated control of the threshold force. In another embodiment, the threshold engagement element (10, 10b) and threshold setting device (9) may comprise correlated arrays of magnets configured such that the rotation of one array with respect to the other may increase or decrease the magnetic attractive force between them without changing the distance between them.

The stop (8) is positioned to block the distal segment (7b) of the swing arm (7) from swinging in a first direction away from the sensor (4). The threshold force prevents the distal segment from losing contact with the stop (8) unless the accelerometer experiences a force of acceleration that moves it in a second direction toward the sensor (4) that is greater than the threshold force holding the distal segment (7b) to the stop (8). The sensor (4) is positioned to be activated by the sensor trigger (10, 10a) when the distal segment (7b) of the swing arm (7) swings a distance D from its position against the stop (8) to the sensor (4), or the sensor's range of detection. When engaged or activated by the sensor trigger (10, 10a), the sensor sends a sensor signal via PCB (3) to a signal receiving device such as an indicator, a display, an effector, or a transmitter. The frame (2) may comprise an access port (5) providing physical access for wires connecting the PCB (3) to a receiving device and/or a power supply. Additionally or alternatively, the PCB (3) may communicate with a receiving device wirelessly. The PCB (3) may additionally be configured to receive signals from an input device to set, reset, and/or program the PCB.

The interaction between the sensor trigger (10, 10a) and the sensor (4) may be one of any of a number of interactions. For example, the sensor trigger may comprise a known mass and the sensor may be a pressure sensor that detects applied pressure and optionally the magnitude of the pressure. The sensor may comprise a light detector that senses a reduction is detected light when covered by a light blocking element in the sensor trigger (10, 10a). An embodiment of the accelerometer comprising a light sensor may comprise a light source providing a background level of light shining on the light sensor. In a preferred embodiment, the sensor trigger (10, 10a) is a permanent magnet and the sensor (4) is a sensor that detects the presence of, and optionally the intensity of, a magnetic field.

In one preferred embodiment, the sensor (4) is a Hall Effect sensor, the threshold setting device (9) comprises a ferromagnetic material, and the sensor trigger (10) and threshold engagement element (10) are embodied as a single rare earth magnet. An advantage of using a sensor that detects a magnetic field is that the placement of the sensor (4) need not be in a line of sight with the sensor trigger (10, 10a). For example, in a variation of the embodiment shown in FIG. 1, the sensor (4) may be positions on the outside surface of the frame (2) opposite the position shown in the figure.

A printed circuit board (PCB) (3) provides for communication between the sensor (4) and a receiving device (not shown) so that a sensed acceleration may be communicated to an indicator device such as a light, sound generator, or computer controlled monitoring and or effector device. A computer controlled monitoring device may comprise a display and/or a data storage device. A computer controlled effector device may be configured to control an operation of a vehicle to which the accelerometer is mounted. For example, the detection of a deceleration have a force a above a threshold force may, via an effector, cause braking and/or throttling down of an engine. The PCB (3) is shown in the figures at a position between the sensor (4) and the frame but may be positioned as desired in or on the frame (2) so long as it is in communication with the sensor (4). The PCB may be integrated with the sensor (4). Additionally or alternatively, the PCB may communicate with a microprocessor coupled to an actuator (16) coupled to a movable threshold setting device (9) and/or a microprocessor of an indicator device, a motorized vehicle, and/or computer controlled monitor. Communication between the accelerometer and remote devices may be wired and/or wireless in nature. For wired communication, the frame (2) may comprise a wire access port (5) for wires to be connected to other devices.

Figure 3:
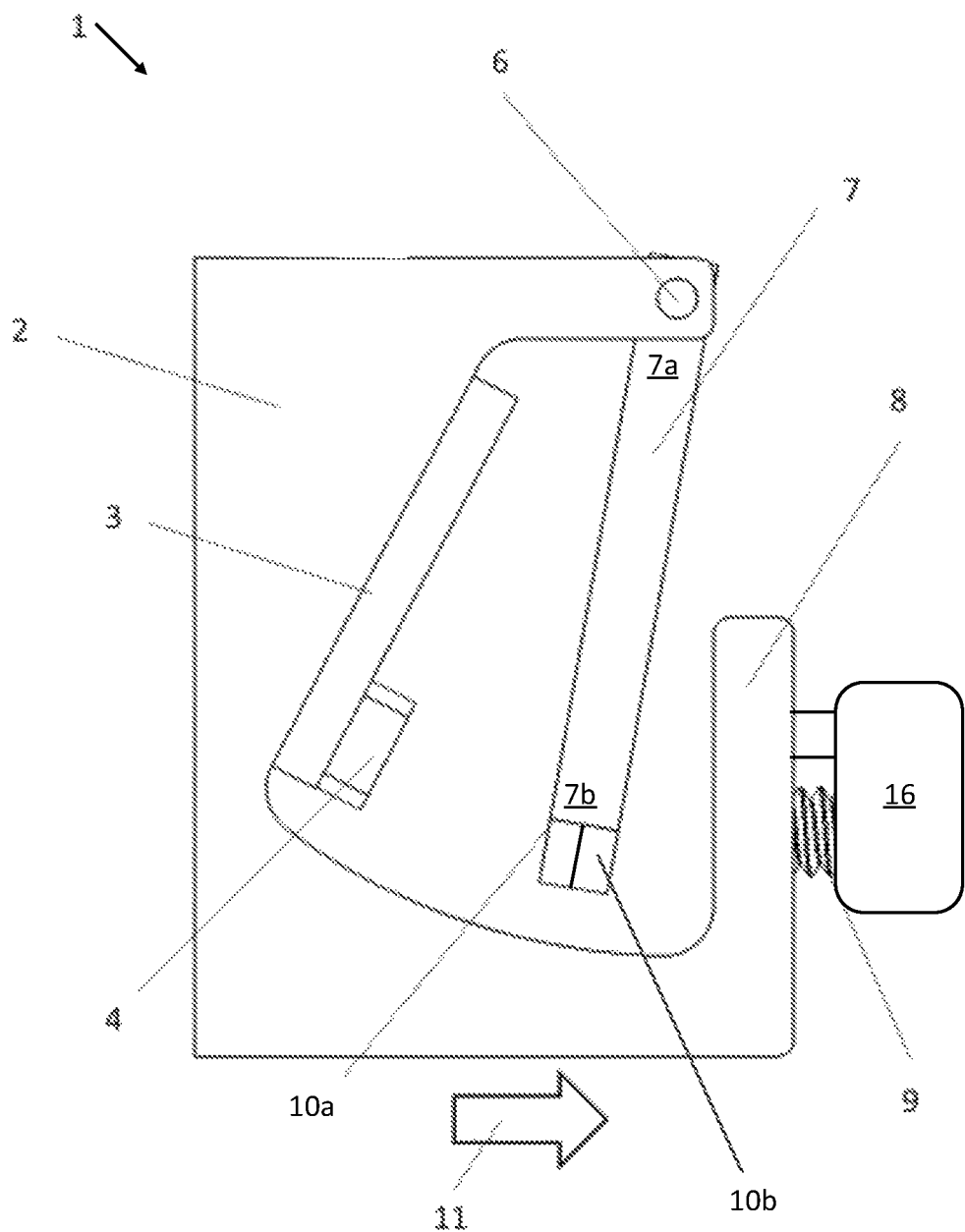
FIG. 3 is a side view of an embodiment of a sensor assembly during an initial period of deceleration.

Referring to FIG. 3, when the accelerometer assembly (1) experiences an acceleration (11) in a first direction opposite that of the arrow in the figure, the stop (8) prevents the swing arm (7) from moving. When the accelerometer (1) experiences an acceleration (11) in a second direction in the same direction as the arrow, the inertia of the swing arm (7) will cause the distal segment (7b) to swing toward the sensor (4) if the force of that acceleration exceeds the threshold force holding the distal segment (7b) against the stop (8). When used as a deceleration sensor for a vehicle, the accelerometer shown in FIG. 3 may be oriented such that the sensor (4) is oriented toward the front of the vehicle in the direction of forward motion, and such that the stop (8) is oriented toward the rear of the vehicle. When oriented in this way, the direction of the arrow is that of the force of vehicle deceleration, or negative acceleration. A deceleration force greater than the threshold force will cause the distal segment (7b) to swing toward the sensor (4).

An embodiment of an accelerometer assembly (1) as shown in FIG. 3 comprises an actuator (16) coupled to the threshold setting device (9). The actuator (16) may be functionally coupled to an input device causing the actuator to move the threshold setting device (9), for example, in response to a user input or computer input to change the threshold force holding the distal segment (7b) against the stop (8). In one example, the threshold setting device (9) may be a ferromagnetic material embodied as a screw that is threaded through a threaded opening in the frame (2) and connected to the actuator (16) such that rotation of the threshold setting device (9) by the actuator moves the threshold setting device (9) closer to or further away from the distal segment (7b) of the swing arm (7). In another example, the threshold setting device (9) may be connected to the actuator (16) and pass through an opening in the frame (2) such that linear motion of the actuator (16) moves the threshold setting device (9) closer to or further away from the distal segment (7b) of the swing arm (7). In yet another example, the threshold setting device (9) may comprise a magnet array correlated with a magnetic array on the distal segment (7b) and the actuator (16) is configured to rotate the threshold setting device (9) relative to the distal segment (7b) of the swing arm (7). In each of these examples, the actuator may be replaced by or augmented by manual movement of the threshold setting device (9).

Figure 4:
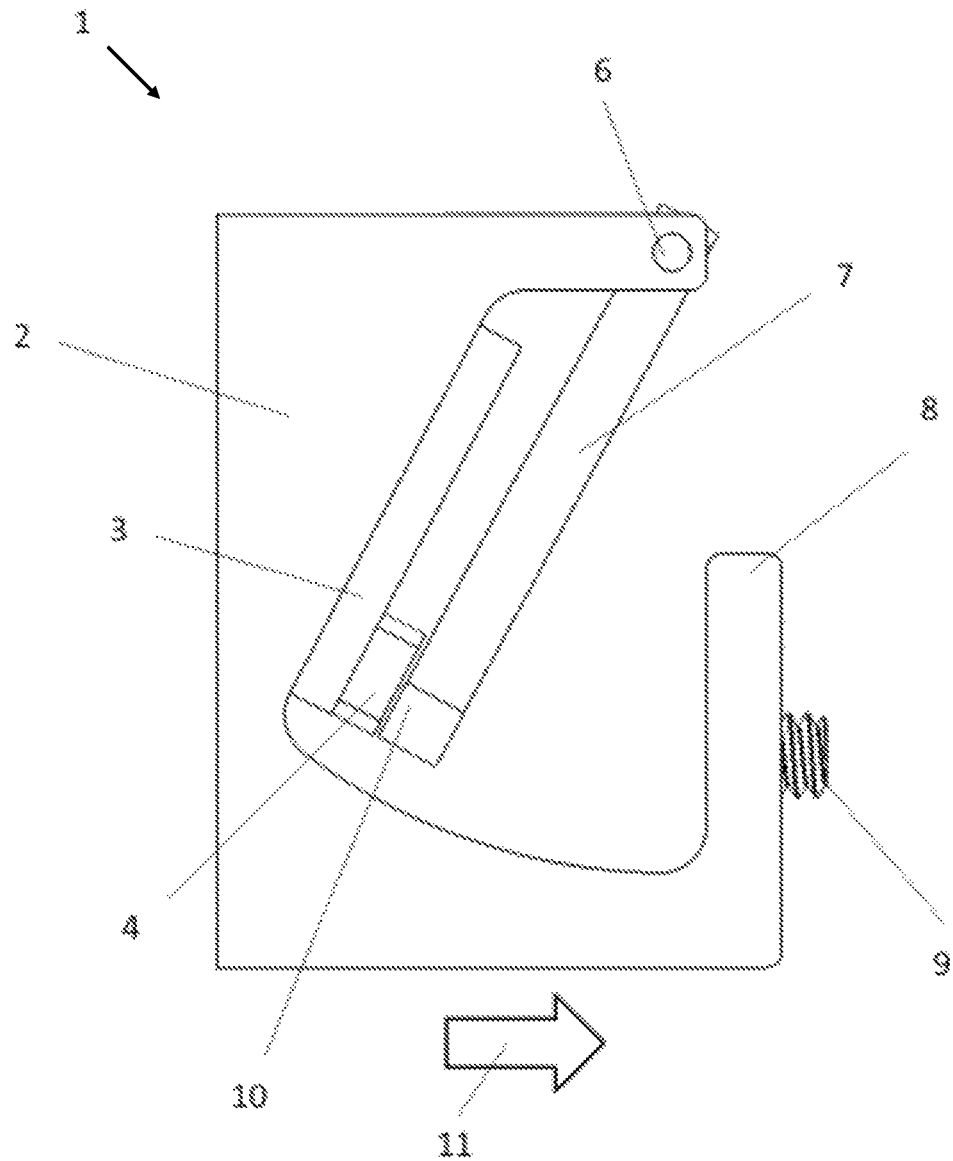
FIG. 4 is a side view of an embodiment of a sensor assembly during sustained deceleration.

Referring now to FIG. 4, a sustained deceleration force causes the sensor trigger (10,10a) to remain in contact with, or in close proximity to, the sensor (4). Depending on the type of sensor and trigger, activation of the sensor may require actual contact between the sensor (4) and sensor trigger (10,10a) or only proximity. For example, when the sensor trigger (10,10a) is a magnet and the sensor senses a magnetic field, the sensor (4) may be triggered without contact when the magnet is sufficiently close in proximity to the sensor (4). If the sensor detects light and the trigger covers the sensor, contact may be required.

When the accelerometer (1) is used in a system to detect and indicate deceleration of a vehicle, the sensor may send a signal via PCB (3) to an indicator device. A technical advantage of this arrangement is that false indications of deceleration are prevented because the PCB (3) may be configured to transmit signals from the sensor (4) to an indicator device only when a signal from the sensor (4) persists for more than a selected duration of time such as 0.1, 0.2, 0.3, 0.4, or 0.5 seconds. In this way, short lived, significant deceleration forces caused by uneven road or snow surfaces, waves, wakes, and pedaling motions are not indicated. The positive mechanical stop (8) and pivot connection (6) prevent the swing arm (7) from moving past the stop (8) under a positive acceleration or from moving in any direction that is not coaxial with the single axis of movement. A short duration of deceleration, even one having a force greater than the threshold force, may be prevented from resulting an indication of deceleration if the PCB (3) is programmed to require a signal from the sensor (4) having a duration longer than that of the short duration of a deceleration event. When the deceleration force ends or diminished sufficiently, the mass of the distal end (7b) of the swing arm will be moved toward the stop (8) by gravity.

Figure 5:
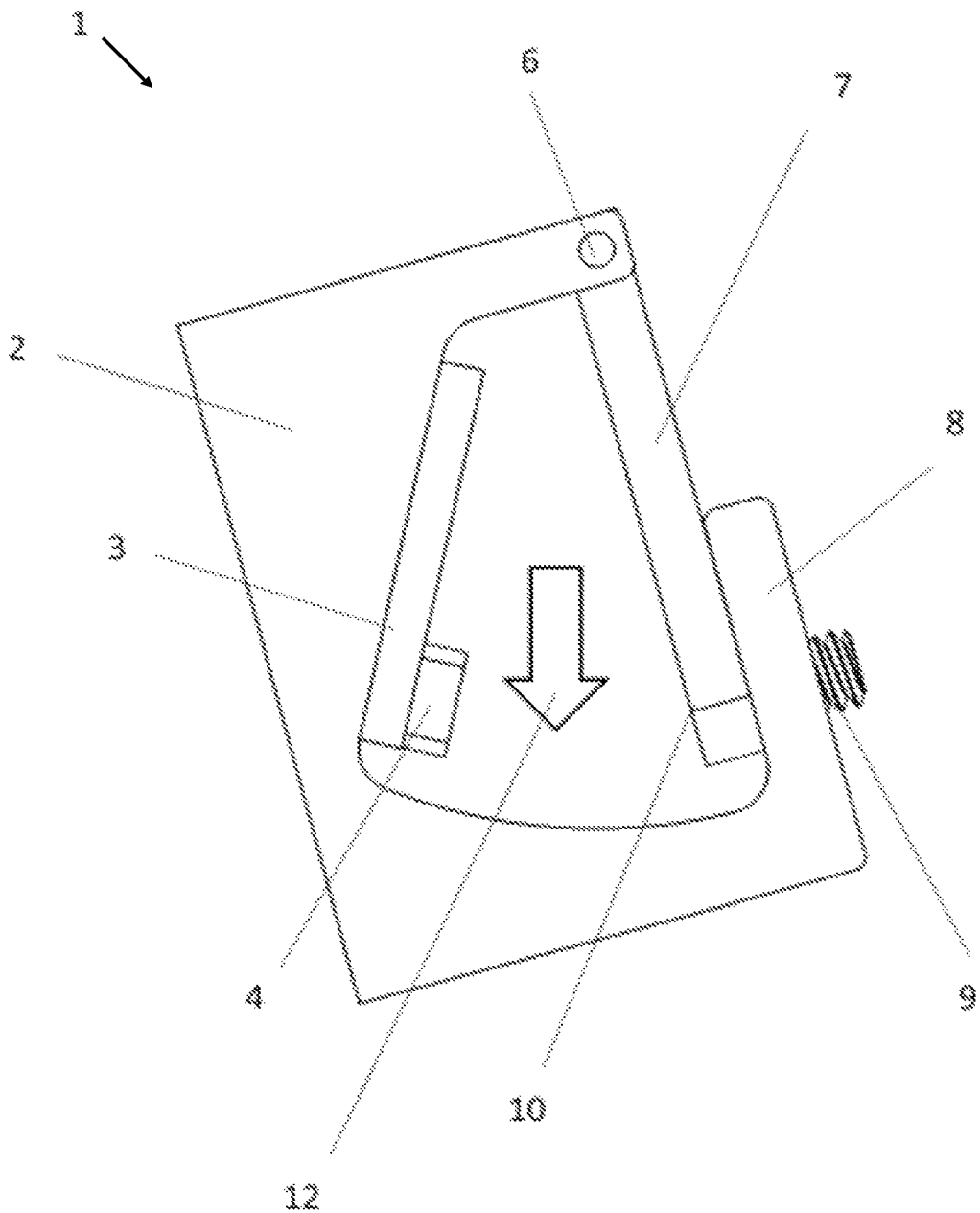
FIG. 5 is a side view of an embodiment of a sensor assembly tilted at an angle.

FIG. 5 illustrates a technical advantage of a single axis pendulum accelerometer when used to detect deceleration of a vehicle that is traveling down a hill. The arrow at the center of the figures indicates the direction of the force of gravity (12) relative to the accelerometer (1) mounted in or on a vehicle moving down a slope. The swing arm (7) is not aligned with the gravity but only a very small fraction of the gravitational force on the swing arm is in a direction away from the threshold engagement element and toward the sensor (4). The threshold force is essentially unchanged because the component of gravitational force moving the distal segment (7b) is very small compared to the threshold force. A simple pendulum without a threshold force holding the distal end (7b) of the swing arm against the stop (8) would trigger often or continuously because gravity would pull the swing arm to a location close enough to the sensor (4) to trigger an indication deceleration. In similar fashion, moving up hill would not prevent the accelerometer from appropriately indication deceleration because the effect of gravity is minimal. The force of gravity on the swing arm (7) remains small compared to the accelerations being measured but is great enough to move the swing arm (7) into a position close enough to the stop for the threshold force to pull it against the stop (8).

Alternative to the embodiments shown in the figures, the swinging pendulum may be replaced by a spheroid having the sensor trigger functionality associated with the distal end (7b) of the swing arm (7) and contained within a guide limiting the movement of the spheroid to a single axis between the stop (8) and the sensor (4) and a travel distance of D.

While the invention has been described in preferred forms, it will be apparent to those skilled in the art that modifications, additions, and deletions made with respect to the explicitly described embodiments are possible without departing from the spirit and scope of the invention.

The invention claimed is:

1. A single axis accelerometer comprising:
a frame, a swing arm, a sensor, a printed circuit board (PCB), a stop, and a threshold setting device wherein:
the swing arm comprises a proximal segment connected to the frame through a pivoting connection allowing the swing arm to swing around a pivot axis and a distal segment comprising a sensor trigger and a threshold engagement element;

wherein:
the stop is positioned to block the distal segment of the swing arm from swinging in a first direction;
the sensor is positioned to be engaged by the sensor trigger when the distal segment of the swing arm swings in a second direction, opposite the first direction;
the PCB communicates with the sensor and is configured to convey sensor data from the sensor to a receiving device;
the threshold setting device is positioned in apposition to the stop and the threshold engagement element when the distal segment of the swing arm is in contact with the stop;
an interaction between the threshold engagement element and the threshold setting device applies a threshold force in the first direction to the distal segment of the swing arm.

2. The single axis accelerometer of claim 1, wherein the threshold engagement device comprises a magnet and the threshold setting device comprises a ferromagnetic material.

3. The single axis accelerometer of claim 2, wherein the magnet is a permanent magnet.

4. The single axis accelerometer of claim 2, wherein the threshold setting device is configured as a screw extending through a threaded hole in the stop and the threshold force may be increased or decreased by turning the screw.

5. The single axis accelerometer of claim 2, wherein the threshold setting device is coupled to an actuator configured to move the threshold setting device relative to the stop and thereby increase or decrease the threshold force.

6. The single axis accelerometer of claim 1, wherein the sensor trigger comprises a permanent magnet and the sensor is a Hall Effect sensor.

7. The single axis accelerometer of claim 1, wherein the sensor trigger comprises a light impermeable material and the sensor is a light sensor.

8. The single axis accelerometer of claim 1, wherein the sensor trigger and the threshold engagement element are embodied as a single same combination sensor trigger and threshold engagement element.

9. A system for registering or indicating an acceleration force exceeding a threshold value, said system comprising:
the single axis accelerometer of claim 1 coupled to a date storage device or an indicator.

10. The single axis accelerometer of claim 1, wherein the sensor trigger comprises a known mass and the sensor is a pressure sensor.

11. A system for indicating an acceleration, said system comprising: the single axis accelerometer of claim 1 coupled to an indicator.

12. The system of claim 11, wherein the system comprises an indicator comprising one or more of a light, a sound generator, and a display.

13. The system of claim 11, wherein the single axis accelerometer is mounted to a vehicle and further comprising an effector coupled to the single axis accelerometer and functionally coupled to a control system of the vehicle.

14. The system of claim 11, further comprising an actuator configured to move the threshold setting device relative to the stop and a user input device functionally coupled to the actuator to control movement of the actuator.

* * * * *